United States Patent
Xu et al.

(10) Patent No.: US 10,250,828 B1
(45) Date of Patent: Apr. 2, 2019

(54) GLOBAL SHUTTER IMAGE SENSOR WITH ANTI-BLOOMING PIXEL AND KNEE POINT SELF-CALIBRATION

(71) Applicant: SmartSens Technology (U.S.), Inc., Shanghai (CN)

(72) Inventors: Chen Xu, Shanghai (CN); Yaowu Mo, Shanghai (CN); Zexu Shao, Shanghai (CN); Zhengmin Zhang, Shanghai (CN); Weijian Ma, Shanghai (CN)

(73) Assignee: SMARTSENS TECHNOLOGY (U.S.), INC., Shanghai (CN)

( * ) Notice: Subject to any disclaimer, the term of this patent is extended or adjusted under 35 U.S.C. 154(b) by 0 days.

(21) Appl. No.: 15/850,936

(22) Filed: Dec. 21, 2017

(51) Int. Cl.
| | |
|---|---|
| H04N 3/14 | (2006.01) |
| H04N 5/335 | (2011.01) |
| H04N 5/365 | (2011.01) |
| H04N 5/3745 | (2011.01) |
| H01L 27/146 | (2006.01) |
| H04N 5/355 | (2011.01) |
| H04N 5/378 | (2011.01) |

(52) U.S. Cl.
CPC ..... *H04N 5/3651* (2013.01); *H01L 27/14656* (2013.01); *H04N 5/3559* (2013.01); *H04N 5/378* (2013.01); *H04N 5/3745* (2013.01)

(58) Field of Classification Search
CPC ..... H04N 5/359; H04N 5/3591; H04N 5/3592
USPC ......................................... 348/241, 294, 302
See application file for complete search history.

(56) References Cited

U.S. PATENT DOCUMENTS

| | | | |
|---|---|---|---|
| 6,731,335 B1 | 5/2004 | Kim et al. | |
| 9,565,375 B1 * | 2/2017 | Raynor | H01L 27/14603 |
| 2008/0198246 A1 * | 8/2008 | Gardner | H04N 5/35509 |
| | | | 348/254 |
| 2009/0127436 A1 * | 5/2009 | Johnson | H01L 27/14656 |
| | | | 250/208.1 |
| 2009/0236644 A1 * | 9/2009 | Adkisson | G06F 17/5063 |
| | | | 257/292 |
| 2010/0271517 A1 * | 10/2010 | De Wit | H04N 5/378 |
| | | | 348/294 |

(Continued)

OTHER PUBLICATIONS

Yannick De Wit, Tomas Geurts; Title: A Low Noise Low Power Global Shutter CMOS Pixel Having Capability and Good Shutter Efficiency; Date: Unknown; pp. 1-4; Pub: Belgium.

*Primary Examiner* — Anthony J Daniels
(74) *Attorney, Agent, or Firm* — Eric Karich; Karich & Associates

(57) ABSTRACT

An image sensor has global shutter imaging pixel cells, each including an anti-blooming transistor gate for modifying electric charge within a photodiode and for setting the photodiode to a selected potential. The sensor also has a row decoder circuit providing readout signals to each row of the imaging cells during both a readout interval and during a calibration interval for each row and providing to the anti-blooming transistor drain a selectable potential supply voltage. A mode select switch within the row decoder circuit applies either a standard drain supply voltage or an adjustable low voltage to the anti-blooming transistor drain. A programmable function logic circuit determines the timing of operation of the mode select switch to provide knee-point calibration to minimize photo conversion variations that lead to fixed pattern noise.

8 Claims, 7 Drawing Sheets

(56) References Cited

U.S. PATENT DOCUMENTS

2015/0008308 A1\* 1/2015 Huang .................... H03M 1/14
250/208.1
2016/0345005 A1\* 11/2016 Hoekstra .............. H04N 5/3592

\* cited by examiner

GLOBAL SHUTTER IMAGE SENSOR WITH ANTI-BLOOMING PIXEL AND KNEE POINT SELF-CALIBRATION

BACKGROUND OF THE INVENTION

Field of the Invention

This invention relates generally to image sensors, and more particularly to CMOS image sensors with global shutter pixels and anti-blooming gates. The present invention provides an apparatus for reducing fixed pattern noise due to variations among image sensor pixels. The image sensor may be incorporated within a digital camera.

Description of Related Art

An image capture device includes an image sensor and an imaging lens. The imaging lens focuses light onto the image sensor to form an image, and the image sensor converts the light into electrical signals. The electric signals are output from the image capture device to other components of a host electronic system. The image capture device and the other components of a host electronic system form an imaging system. Image sensors have become ubiquitous and may be found in a variety of electronic systems, for example, a mobile device, a digital camera, a medical device, or a computer.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. However, miniaturization has come with the loss of pixel photosensitivity and dynamic range which require new approaches in order to mitigate these losses.

In addition to an array of pixels, a typical image sensor substrate or chip further includes readout circuitry. Some portion of the readout circuitry may reside within each pixel depending on demands of a particular design. Two of the most common methods for reading off the image signals generated on a sensor chip are the rolling shutter mode and the global shutter mode. The rolling shutter mode involves exposing different lines of the sensor array at different times and reading out those lines in a chosen sequence. The global shutter mode involves exposing each pixel simultaneously and for the same length of time, similar to how a mechanical shutter operates on a legacy "snapshot" camera. Prior art digital imaging systems have utilized either rolling shutter or global shutter readout modes.

Rolling shutter (RS) mode exposes and reads out adjacent rows of the array at different times, that is, each row will start and end its exposure slightly offset in time from its neighbor. The readout of each row follows along each row after the exposure has been completed and transfers the charge from each row into the readout node of the pixel. Although each row is subject to the same exposure time, the row at the top will have ended its exposure a certain time prior to the end of the exposure of the bottom row of the sensor. That time depends on the number of rows and the offset in time between adjacent rows. A potential disadvantage of rolling shutter readout mode is spatial distortion which results from the above. The distortion becomes more apparent in cases where larger objects are moving at a rate that is faster than the readout rate. Another disadvantage is that different regions of the exposed image will not be precisely correlated in time and appear as a distortion in the image. To improve signal to noise in the image signal final readout, specifically to reduce temporal dark noise, a reference readout called correlated double sampling (CDS) is performed prior to the conversion of each pixel charge to an output signal by an amplifier transistor. The amplifier transistor may typically be a transistor in a source-follower (SF) or common drain configuration wherein the pixel employs a voltage mode readout.

Global shutter (GS) mode exposes all pixels of the array simultaneously. This facilitates the capture of fast moving events, freezing them in time. Before the exposure begins all the pixels are reset (RST) to the same ostensibly dark level by draining all their charge. At the start of the exposure, each pixel begins simultaneously to collect charge and is allowed to do so for the duration of the exposure time. At the end of the exposure each pixel transfers charge simultaneously to its readout node. Global shutter mode can be configured to operate in a continuous manner whereby an exposure can proceed while the previous exposure is being readout from the readout storage nodes of each pixel. In this mode the sensor has 100% duty cycle which optimizes time resolution and photon collection efficiency. There is no artifact in the image of the period of transient readout that occurs in rolling shutter mode. Global shutter can be regarded as essential when exact time correlation is required between different regions of the sensor area. Global shutter is also very simple to synchronize with light sources or other devices.

Global shutter mode demands that a pixel contain at least one more transistor or storage component than a pixel using rolling shutter mode. Those extra components are used to store the image charge for readout during the time period following simultaneous exposure. Again in order to improve signal to noise in the image signal, a reference readout is required not only to be performed prior to the conversion of each pixel charge to an output signal by an amplifier transistor, but also prior to the transfer of the pixel charge to the extra components of the pixel used to store the image charge during readout.

In summary, rolling shutter can deliver the lowest read noise and is useful for very fast streaming of data without synchronization to light sources or peripheral devices. However it carries risk of spatial distortion especially when imaging relatively large, fast moving objects. There is no risk of spatial distortion when using global shutter and when synchronizing to fast switching peripheral devices it is relatively simple and can result in faster frame rates. Flexibility to offer both rolling shutter and global shutter can be very advantageous.

Fixed-pattern noise (FPN) is the term given to a particular noise pattern on digital imaging sensors often noticeable during longer exposure shots where particular pixels are susceptible to giving brighter intensities above the general background noise. FPN is a general term that identifies a temporally constant lateral non-uniformity (forming a constant pattern) in an imaging system with multiple pixels. It is characterized by the same pattern of 'hot' (brighter) and cold (darker) pixels occurring with images taken under the same illumination conditions in an imaging array. This problem arises from small differences in the individual responsivity of the sensor array (including any local post amplification stages) that might be caused by variations in the pixel size, material or interference with the local circuitry. It might be affected by changes in the environment like different temperatures, exposure times, etc.

The term "fixed pattern noise" usually refers to two parameters. One is the DSNU (dark signal non-uniformity), which is the offset from the average across the imaging array at a particular setting (temperature, integration time) but no external illumination and the PRNU (photo response non-uniformity), which describes the gain or ratio between optical power on a pixel versus the electrical signal output. In practice, a long exposure (integration time) emphasizes the inherent differences in pixel response so they may become a visible defect, degrading the image. Although FPN does not change appreciably across a series of captures, it may vary with integration time, imager temperature, imager gain and incident illumination, it is not expressed in a random (uncorrelated or changing) spatial distribution, occurring only at certain, fixed pixel locations.

An opportunity for improvement of fixed pattern noise in image sensors arises when certain components are employed on the sensor chip and also to enhance its ability to adequately image both high lights and dark shadows in a scene. The present invention fulfills these needs and provides further advantages as described in the following summary.

SUMMARY OF THE INVENTION

The present invention teaches certain benefits in construction and use which give rise to the objectives described below.

An image sensor has a plurality of global shutter imaging pixel cells. Each pixel cell has a photodiode, a transfer transistor, a reset transistor, an anti-blooming transistor, a source follower amplifier and a global shutter image signal storage and readout circuit block. The photodiode, the transfer transistor, and the reset transistor are disposed within the pixel for accumulating an image charge in response to light incident upon the photodiode. The source follower amplifier and global shutter image signal storage and readout circuit block are disposed within the pixel for converting the image charge into an image signal and conveying it to circuits external to the pixel for image processing. The anti-blooming transistor is disposed within the pixel to shunt off excess image charge caused by the incident light once the photodiode becomes full. The pixel cell is supported by an external circuit comprising a row decoder with a mode select feature which reduces fixed pattern noise.

A primary objective of the present invention is to provide an image sensor pixel having advantages not taught by the prior art.

A further objective of the present invention is to provide an apparatus and a method for reducing fixed pattern noise due to variations among image sensor pixels.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above-described drawing figures illustrate the invention, an image sensor with pixel cells with signal noise reduction components and global shutter readout mode. Various embodiments of the image sensor are disclosed herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

A substrate may have a front side and a back side. Any fabrication process that is performed from the front side may be referred to as a frontside process while any fabrication process that is performed from the back side may be referred to as a backside process. Structures and devices such as photodiodes and associated transistors may be formed in a front surface of a substrate. A dielectric stack that includes alternating layers of metal routing layers and conductive via layers may be formed on the front surface of a substrate.

The terms "connected" and "coupled," which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). In the present invention of a stacked chip arrangement the front sides of two chips may be directly connected since the electrical interconnects on each chip will most commonly be formed on the front sides of each chip. When reference is made to certain circuit elements residing within or formed in a substrate this is generally accepted to mean the circuits reside on the front side of the substrate.

Figure 1:
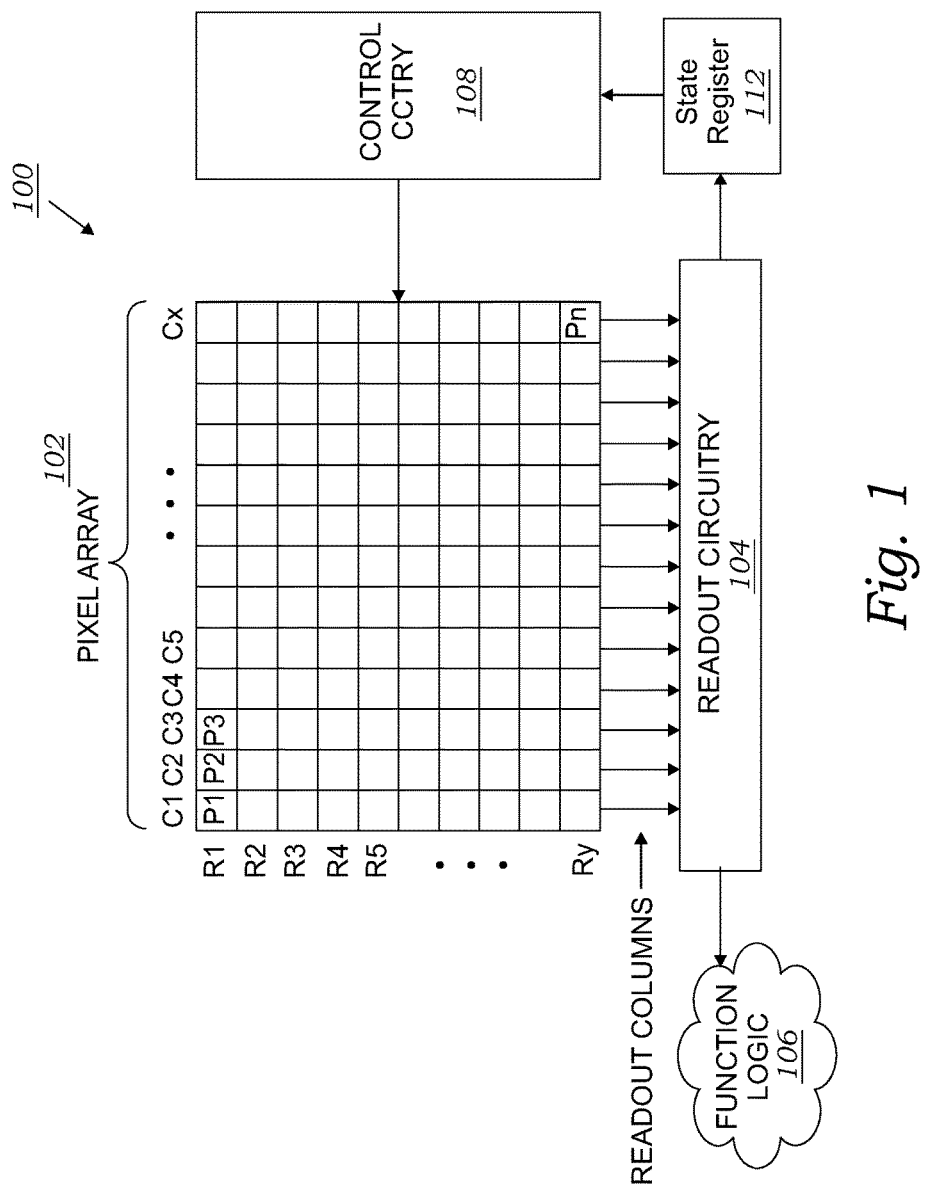
FIG. 1 is a diagram illustrating an imaging system including a pixel array having image sensor pixel cells included in an integrated circuit system according to a first embodiment of the present invention.

FIG. 1 is a diagram illustrating a first embodiment of an image sensor system 100 including a pixel array 102 having a plurality of image sensor pixels included in an example integrated circuit system with features in accordance with the teachings of the present invention. As shown in the depicted example, imaging system 100 includes pixel array 102 coupled to control circuitry 108 and readout circuitry 104, which is coupled to function logic 106.

The control circuitry 108 may include a row decoder and a row driver with required timing circuits while readout circuitry 104 may include a column decoder and a column driver with required timing circuits. The control circuitry 108 and the readout circuitry 104 are in addition coupled to state register 112. In one example, the pixel array 102 is a two-dimensional (2D) array of image sensor pixels (e.g., pixels P1, P2 . . . , Pn). As illustrated, each pixel is arranged into a row (e.g., rows R1 to Ry) and a column (e.g., column C1 to Cx) to acquire image data of a person, place, object, etc., which can then be used to render a 2D image of the person, place, object, etc. Pixels in a given row share reset lines, so that a whole row is reset at a time. The row select lines of each pixel in a row are tied together as well.

The outputs of each pixel in any given column are tied together. Since only one row is selected at a given time by a decoder, no competition for the output line occurs.

In one example, after each pixel has acquired its image data or image charge, the image data is readout by readout circuitry 104 using a readout mode specified by state register 112 and then transferred to function logic 106. In various examples, readout circuitry 104 may include amplification circuitry, analog-to-digital (ADC) conversion circuitry, or otherwise. State register 112 may include a digitally programmed selection system to determine whether readout mode is by rolling shutter or global shutter. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated) or may readout the image data using a variety of other techniques (not illustrated), such as a serial readout or a full parallel readout of all pixels simultaneously. In one example, control circuitry 108 is coupled to pixel array 102 to control operational characteristics of pixel array 102. Some aspects of the operation of control circuitry 108 may be determined by settings present in state register 112. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
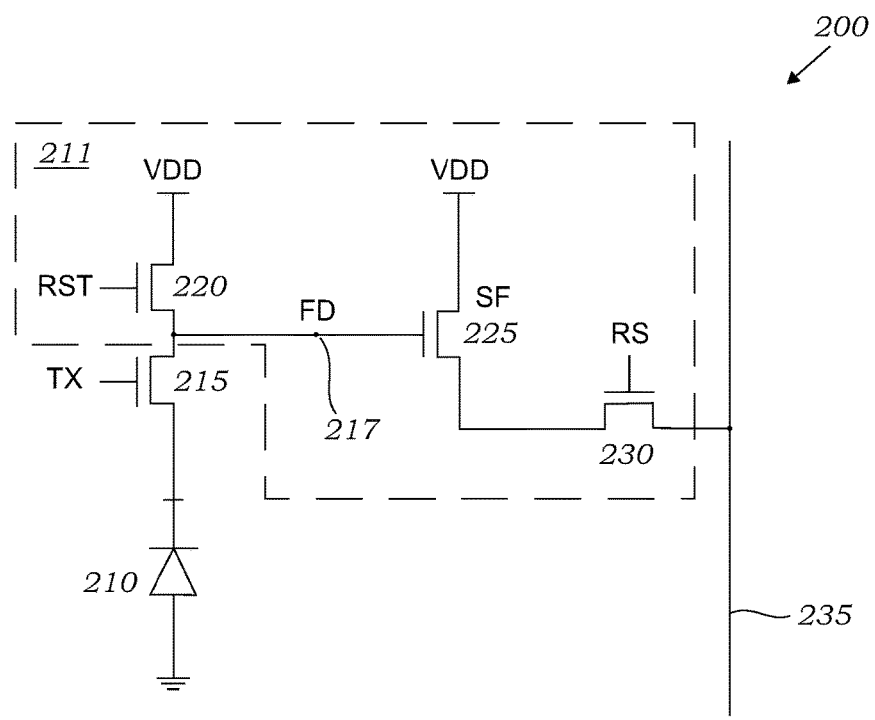
FIG. 2 is an electrical schematic that illustrates an image sensor pixel cell with rolling shutter readout found in the prior art.

FIG. 2 is an electrical schematic that illustrates an image sensor pixel cell with rolling shutter readout found in the prior art. This figure and example pixel are provided to simplify explanation of pixel operation in anticipation of a description of an example of the present invention. Each sensor pixel 200 includes a photodiode 210 (e.g., photosensitive element) and pixel support circuitry 211 as shown. Photodiode 210 may be a "pinned" photodiode as is commonly present in CMOS image sensors. In one example, pixel support circuitry 211 includes a reset transistor 220, source follower (SF) amplifier transistor 225, and row select transistor 230 coupled to a transfer transistor 215 and photodiode 210. During operation, photosensitive element 210 photo-generates charge in response to incident light during an exposure period. Transfer transistor 215 is coupled to receive a transfer signal TX, which causes transfer transistor 215 to transfer the charge accumulated in photodiode 210 to floating diffusion (FD) node 217. Floating diffusion 217 is in effect the drain of the transfer transistor while the photodiode is the source of transfer transistor 215. In one embodiment transfer transistor is a metal-oxide semiconductor field-effect transistor (MOSFET). Reset transistor 220 is coupled between power rail VDD and floating diffusion node 217 to reset sensor pixel 200 (e.g., discharge or charge floating diffusion node 217 and photodiode 210 to a preset voltage) in response to a reset signal RST. Floating diffusion node 217 is coupled to control the gate terminal of source-follower transistor 225. Source-follower transistor 225 is coupled between power rail VDD and row select transistor 230 to amplify a signal responsive to the charge on the floating diffusion FD node 217. Row select transistor 230 couples the output of pixel circuitry from the source-follower transistor 225 to the readout column, or bit line 235, in response to a row select signal RS. Photodiode 210 and floating diffusion node 217 are reset by temporarily asserting the reset signal RST and transfer signal TX. The accumulating window (e.g., exposure period) begins when the transfer signal TX is de-asserted, which permits incident light to photo-generate charge in photodiode 210. As photo-generated electrons accumulate in photodiode 210, its voltage decreases (electrons are negative charge carriers). The voltage or charge on photodiode 210 is representative of the intensity of the light incident on photodiode 210 during the exposure period. At the end of the exposure period, the reset signal RST is de-asserted, which turns off the reset transistor 220 and isolates floating diffusion FD node 217 from VDD. The transfer signal TX is then asserted to couple photodiode 210 to floating diffusion node 217. The charge is transferred from photodiode 210 to the floating diffusion FD node 217 through transfer transistor 215, which causes the voltage of floating diffusion FD node 217 to drop by an amount proportional to photo-generated electrons accumulated on photodiode 210 during the exposure period.

Conventionally, CMOS image sensors have several limitations, for example, limited dynamic range and blooming. CMOS imagers generally are characterized by a linear voltage-to-light response, that is, the imager output voltage is approximately linearly proportional to the integrated intensity of the light incident on the imager. The imager output voltage can be characterized by a dynamic range, given as the ratio of the maximum detectable illumination intensity of the imager to the minimum detectable illumination intensity of the imager. It is well understood that the dynamic range of the output voltage sets the overall dynamic range of the imager. The illumination intensity that causes the photodiode capacitance charge to be completely dissipated prior to the end of the exposure period, thereby saturating the pixel, sets the upper end of the pixel dynamic range, while thermally generated photodiode charge and other noise factors set the lower end of the pixel dynamic range. If the dynamic range of a scene to be imaged exceeds the dynamic range of an imager, portions of the scene will saturate the imager and appear either completely black or completely white. This can be problematic for imaging large dynamic range scenes, such as outdoor scenes. Efforts to reduce the impact of reset sampling noise on dynamic range have relied on correlated double sampling (CDS). CDS is a technique of taking two samples of a signal out of the pixel and subtracting the first from the second to remove reset sampling noise. Generally, the sampling is performed once immediately following reset of the photodiode and floating diffusion and once after the photodiode has been allowed to accumulate charge and transfer it to the floating diffusion. The subtraction is typically performed in peripheral circuitry outside of the pixel and may increase conventional image sensor area although it may not increase pixel area. An image sensor utilizing a rolling shutter readout mode may incorporate CDS with only added peripheral circuit elements and no additional circuit elements in the pixel.

Another problem from which conventional CMOS image sensors suffer is a phenomenon called blooming. Image sensor devices that integrate charge created by incident photons have dynamic range limited by the amount of charge that can be collected and held in a given photosite. For example, the maximum amount of charge that can be collected and detected in a pixel is proportional to the pixel area. During the optical integration period, electrons are created in a pixel well at a rate proportional to the light intensity reaching the sensing area. As the electrons are collected in the photodetector, it begins to fill. If the photodetector charge well becomes full of charge, it becomes saturated and blooming may occur. Blooming is a phenomenon in which excess charge from a pixel spills over into adjacent pixels, causing blurring and related image artifacts. Blooming may cause the neighboring pixels to look brighter than an accurate representation of the light absorbed by the photodiode in that pixel.

One solution for blooming is shunting off the excess current caused by the incoming light once the pixel becomes full. A mechanism for doing this uses an anti-blooming (AB) transistor, which is ordinarily used to remove all electrons from global shutter pixel well before beginning an exposure. During exposure, the anti-blooming transistor can be biased slightly to operate in the sub-threshold region, allowing excess charge to flow to the anti-blooming transistor drain. The use of an anti-blooming transistor to prevent blooming is very sensitive to the voltage applied to the AB transistor gate. If the gate voltage is too low, no electrons (or an insufficient number of electrons) will be shunted out of the pixel well and blooming may occur. If the gate voltage is too high, blooming will be prevented, but at the cost of limiting the dynamic range of the pixel, because electrons will be shunted out of the pixel well before the well is full, limiting the maximum charge that can be collected. The optimum voltage is the voltage needed to slightly turn "on" the pixel AB transistor slightly, just enough to shunt excess charge to a voltage source and prevent it from bleeding into nearby pixels when it is exposed to light. However, the actual voltage applied to the AB transistor gate depends on a variety of factors, including manufacturing process parameters and the temperature of the imager array. For example, the AB transistor gate electrode threshold voltage may vary due to manufacturing process non-uniformities. Since the AB transistor may be biased in its sub-threshold region the actual bias voltage may vary from imager array to imager array and from pixel to pixel within an array.

Prior approaches to managing this impact of the mismatch in the AB transistors failed to account for these variations, and suffered from blooming or reduced dynamic range and a relatively high level of an artifact known as fixed pattern noise (FPN). The result is a noise pattern evident in captured images that is constant and reproducible from one image to another. Fixed pattern noise (FPN) is easily apparent to a human observer of an image due to the observer's inherent sensitivity to edges in the image. Manufacturers have compensated for the repeating fixed pattern noise errors in a number of manners. One solution used by manufacturers has been to provide a fixed pattern noise error register for each column (or row) in an array whereby the register associated with the specific column would have a stored error correction value to correct the noise associated with that column. It should be noted that typically the noise associated with the column (or row) would be applied to each storage element in the entire column (or row). While effective, the design costs of implementing a storage location for each column (or row) in a photosensitive array is large, thereby resulting in increased design cost. Consequently, any system which reduces the FPN in an image presented to an observer would be advantageous.

Figure 3:
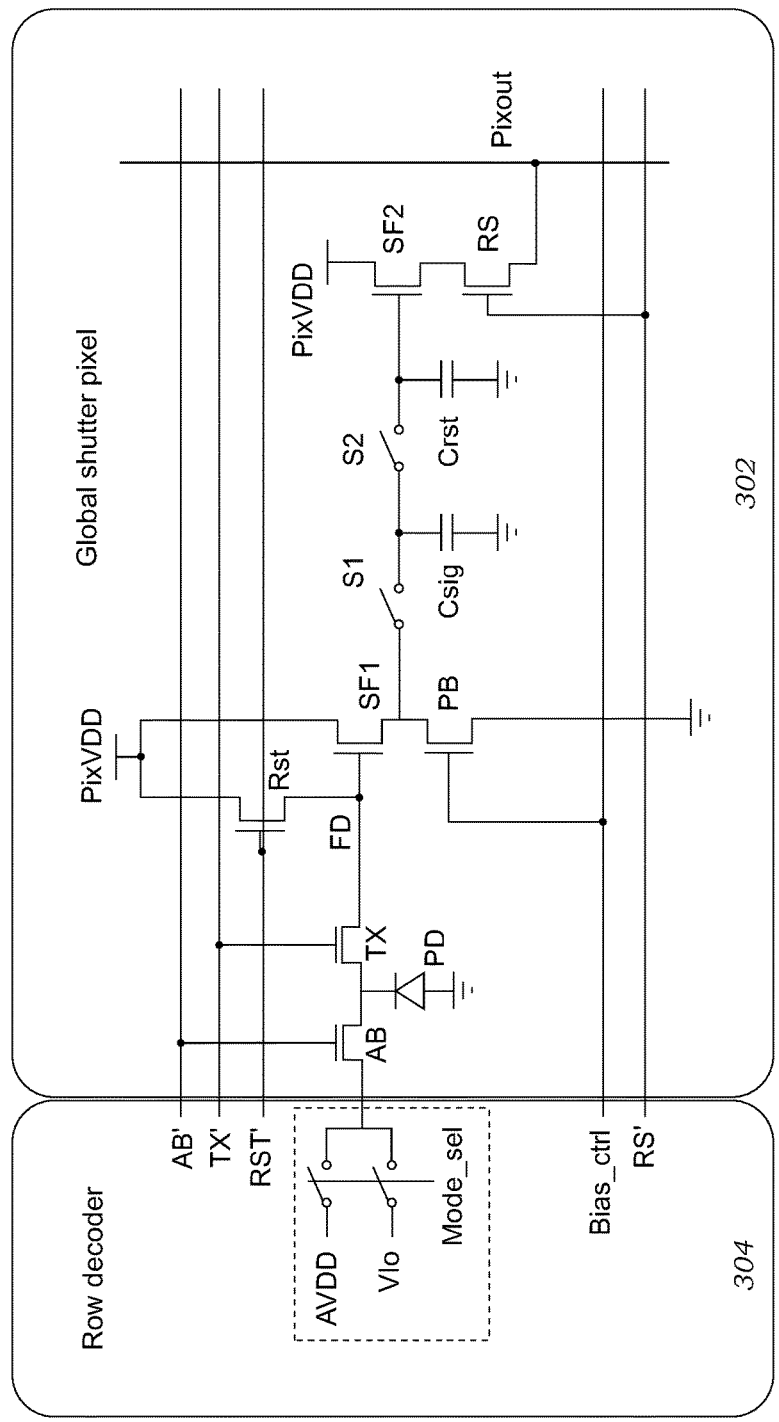
FIG. 3 is an electrical schematic diagram of a representative global shutter pixel portion of an image sensor array and an associated row decoder circuit portion of the image sensor in accordance with the first embodiment of the invention.

FIG. 3 is an electrical schematic diagram of a representative global shutter pixel portion 302 of an image sensor array and an associated row decoder circuit 304 of the image sensor in accordance with the first embodiment of the invention. The electrical schematic diagram shown in FIG. 3 more clearly illustrates the electrical connections between the electrical components. FIG. 3 depicts a transfer transistor TX coupled to photodiode PD and floating drain FD for accumulating and transferring an image charge in response to light incident upon the photodiode. Also residing on pixel cell 302 is a reset transistor Rst and an amplifier transistor SF1 which are configured with a pixel bias transistor PB for converting the image charge to an image signal voltage (PIXO) and for coupling the image signal out of amplifier transistor SF1. Also residing on pixel cell portion 302 are global shutter signal storage capacitor Csig and global shutter reset capacitor Crst which are connected to amplifier SF1 through switch transistors S1 and S2 and also to a pixel output amplifier transistor SF2 and a row select transistor RS. In addition, an anti-blooming transistor AB is connected to photodiode PD for the purpose of preventing excess charge from spilling over from the photodiode to surrounding photodiodes and circuit elements. The operation of the global shutter pixel circuitry is known to those familiar with the art. The main function is to store an image signal on capacitor Csig representative of an image charge accumulated by the photodiode during a set integration period as defined by an integration period signal applied to transfer transistor TX.

One refinement of pixels incorporating an anti-blooming transistor is the pixel design in which the AB transistor gate electrode control signal, AB', is stepped up (or down) in voltage monotonically from a starting point to a high (or low) end point during the photodiode integration period when a high light intensity is determined to be incident on the photodiode. Signal AB' is generally kept in the sub-threshold region of transistor AB. As described earlier, under high light intensity conditions an anti-blooming transistor may be set at a gate electrode bias level suitable to drain from the photodiode any charge above a designed level to prevent saturation of the photodiode and overflow of charge to nearby photodiodes. In this way the pixel full well charge is modified dynamically in response to the incident image intensity. Typically the drain of the anti-blooming transistor is set at a positive high level, for example, an analog power supply level named AVDD. AVDD may be a voltage near the high positive power supply allowed for the technology generation in which the image sensor is fabricated. The previously described refinement of pixels which incorporates a mode in which the anti-blooming transistor gate electrode is stepped up steadily during the integration period accomplishes a more gradual draining of charges from the photodiode during a portion of the integration period. The result is a type of enhanced dynamic range in which the photodiode transfer curve is transformed from a single rising line to one with two or more sections and slopes as illustrated in FIGS. 4A and 4B.

Figure 4A:
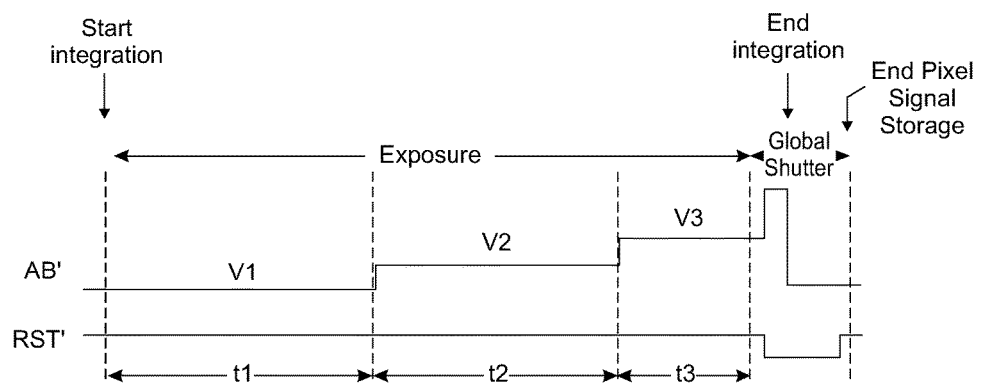
FIG. 4A is a timing diagram illustrating signals applied a global shutter pixel in a manner to achieve an improved dynamic range in accordance with the first embodiment of the invention.

FIG. 4A illustrates two signals, AB' and RST,' applied to the global shutter pixel illustrated in FIG. 3 in a manner to achieve an improved dynamic range. FIG. 4A shows signal levels for signals AB' and RST' during a time interval starting at the beginning of an integration period and ending after the pixel charge has been converted to a pixel signal voltage and stored on global shutter storage capacitor Csig. Signal RST' is at a high level during an exposure time portion of the integration period and then goes low. With signal RST' high transistor RST is maintaining charge storage node FD near voltage PixVDD and then when RST' is low transistor RST is turned off to facilitate transferring image charge from photodiode PD to node FD and through amplifier transistor SF1 on to capacitor Csig before transistor RST is set high again for the next integration and exposure periods. Signal AB' is shown to progress through at least three successively higher levels, V1, V2, and V3 during three respective intervals t1, t2, and t3 of the exposure period with each level draining successively more charge from photodiode PD to prevent it from saturating.

Figure 4B:
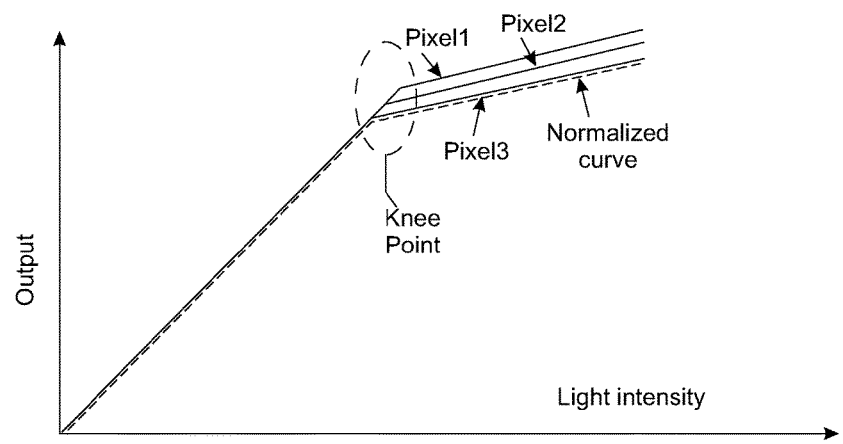
FIG. 4B illustrates the rise in accumulated pixel photodiode charge as a function of light intensity during an exposure period for thee pixels.

FIG. 4B illustrates, for a fixed exposure time, the pixel transfer curve or its image signal output versus light intensity function for three representative pixels, Pixel1, Pixel2, and Pixel3. The graph illustrated shows a two segment piecewise linear curve formed by two joined line segments with different slopes, the upper line segment having a lower slope. The break point or knee point is the point where the signal on the anti-blooming transistor begins to remove charge from the photodiode and the slope of the upper segment is determined by the amount of light generated charge is drained off the photodiode through AB. FIG. 4B shows the upper line segments for the three pixels to be displaced from one another. This displacement is thought to be due to the variation in the respective anti-blooming transistor gate electrode threshold voltages for the three pixels illustrated. This variation is due to manufacturing variation and may result in unwanted fixed pattern noise FPN. It is the principal objective of the invention described herein to minimize the FPN artifacts related to the anti-blooming transistor gate electrode threshold voltage variation. The invention as described in the following employs a self-calibration apparatus and method to minimize the knee point variation related to the anti-blooming transistor gate electrode variation.

One key inventive apparatus element of the present invention providing an advantage over the prior art is the portion of the invented row decoder circuit 304 as illustrated in FIG. 3 denoted by Mode_sel. Row decoder circuit 304 provides to each row of pixels the signals AB', TX', RST' and RS' to transistors AB, TX, RST and RS respectively during the course of image capture, storage and readout for each row of the imaging pixel array. Bias_ctrl provides a DC bias to transistor PB and Mode_sel provides either bias AVDD or Vlo to the drain of transistor AB. The inventive element involves Mode_sel providing either AVDD or Vlo in a manner which results in a reduction of the impact of any AB transistor threshold voltage on imaging array fixed pattern noise. The voltage level Vlo may be from zero to 0.5 volts. One inventive method incorporating the Mode_sel shown in apparatus of FIG. 3 for reducing FPN in an image sensor utilizing anti-blooming transistors to enhance pixel dynamic range is illustrated in FIG. 5.

Figure 5:
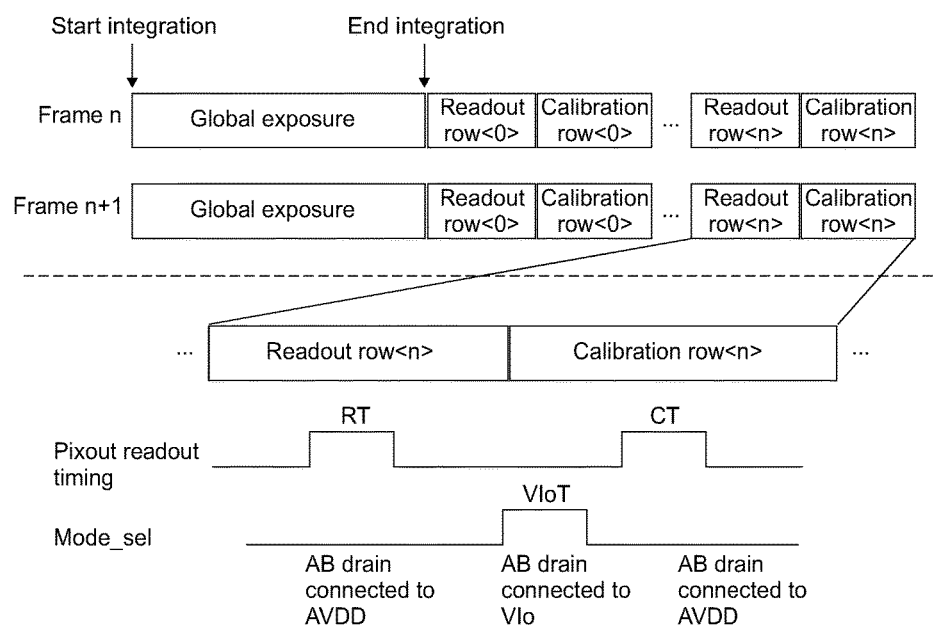
FIG. 5 is a timing diagram that illustrates a method for knee point calibration in accordance with the first embodiment of the invention.

FIG. 5 is a timing diagram that illustrates the invented method for knee point calibration. Illustrated are image sensor control circuitry and readout circuitry functioning in sequences defined according to a function logic circuit, for example like function logic 106 as illustrated in FIG. 1, to collect and readout in a global shutter mode an image signal over two frames n and n+1. The sequence for frame n begins with a global exposure step in which all rows of an image array are exposed to incident light forming an image. FIG. 4A illustrates the movements of signals AB' and RST' during this step. Following the global exposure step is a readout step for the zeroth row followed by a calibration step for the zeroth row. The readout and calibration steps repeat for each row until the last row, row n, and then repeat for the next frame, Frame n+1.

FIG. 5 additionally illustrates more detail within the readout and calibration steps. The timing line denoted "Pixel readout timing" shows pixels of row n being readout during an interval RT within the readout step and also during an interval CT within the calibration step. Of particular relevance to the invention is the timing line denoted "Mode_sel" wherein anti-blooming transistor AB drain electrode is shown to be connected to supply AVDD at all times throughout the readout and calibration steps except for a time interval VolT during the calibration step during which it is switched to supply Vlo. According to the inventive idea by switching the AB transistor drain to supply Vlo a programmable amount of charge is injected into each photodiode along a row. Without the interval VloT wherein the AB drain is switched to Vlo the photodiodes along the row are rendered free of most of their charge prior to the next exposure period. By switching the AB drain to Vlo it is possible to compensate for AB transistor threshold voltage variations and also to more precisely set the knee point thereby reducing fixed pattern noise and exercising more precise control over the charging characteristics of the photodiodes under high illumination.

Figure 6:
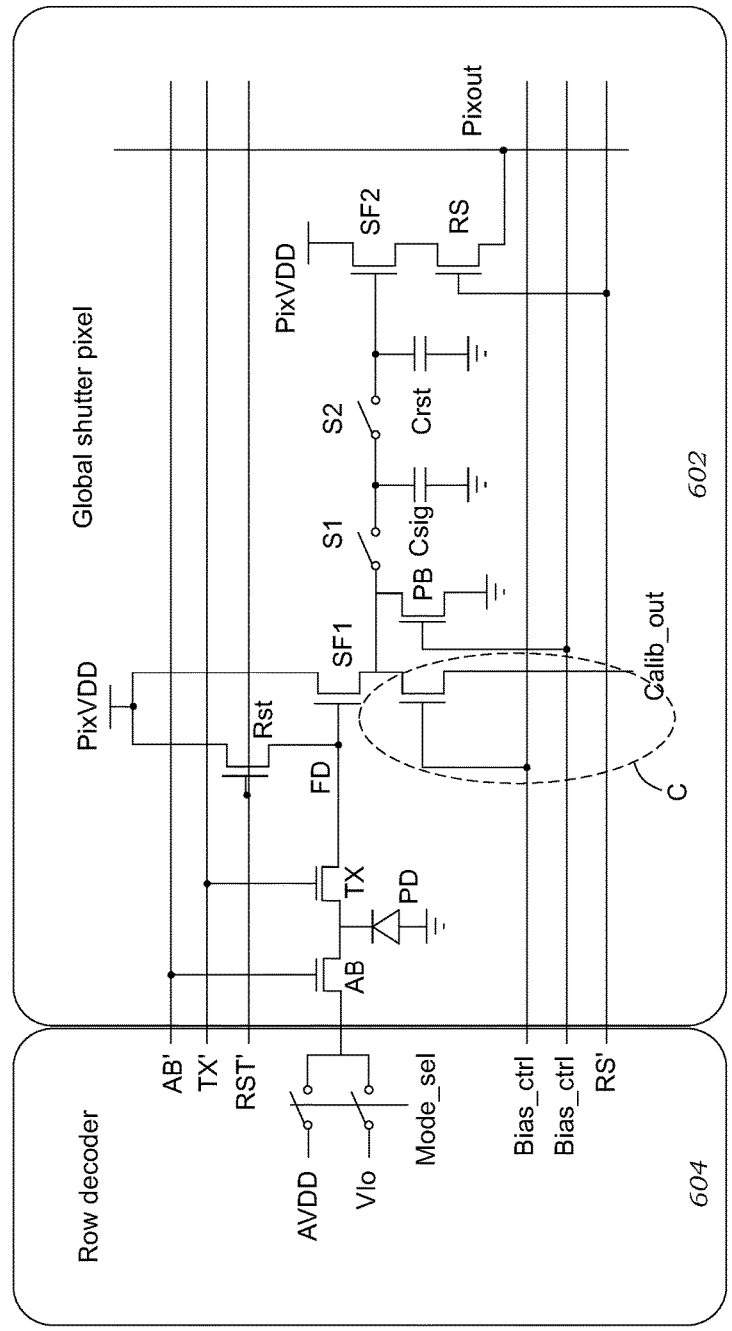
FIG. 6 is an electrical schematic diagram of a representative global shutter pixel portion of an image sensor array and an associated row decoder circuit portion of the image sensor in accordance with a second embodiment of the invention.

FIG. 6 is an electrical schematic diagram of a representative global shutter pixel portion 602 of an image sensor array and an associated row decoder circuit portion 604 of the image sensor in accordance with a second embodiment of the invention. The electrical schematic diagram shown in FIG. 6 more clearly illustrates the electrical connections between the electrical components. The electrical circuit illustrated in FIG. 6 is the same as that illustrated by FIG. 3 with the addition of calibration transistor C. Calibration transistor C has its drain electrode connected to the source electrode of transistor SF1, its gate electrode connected to signal line Calib_en, and its source connected to an off pixel node named Calib_out. When Calibration transistor C is enabled by signal Calib_en a portion of the image signal being output by output transistor SF1 is coupled through to Calib_out which can be used for adjusting knee points.

Figure 7:
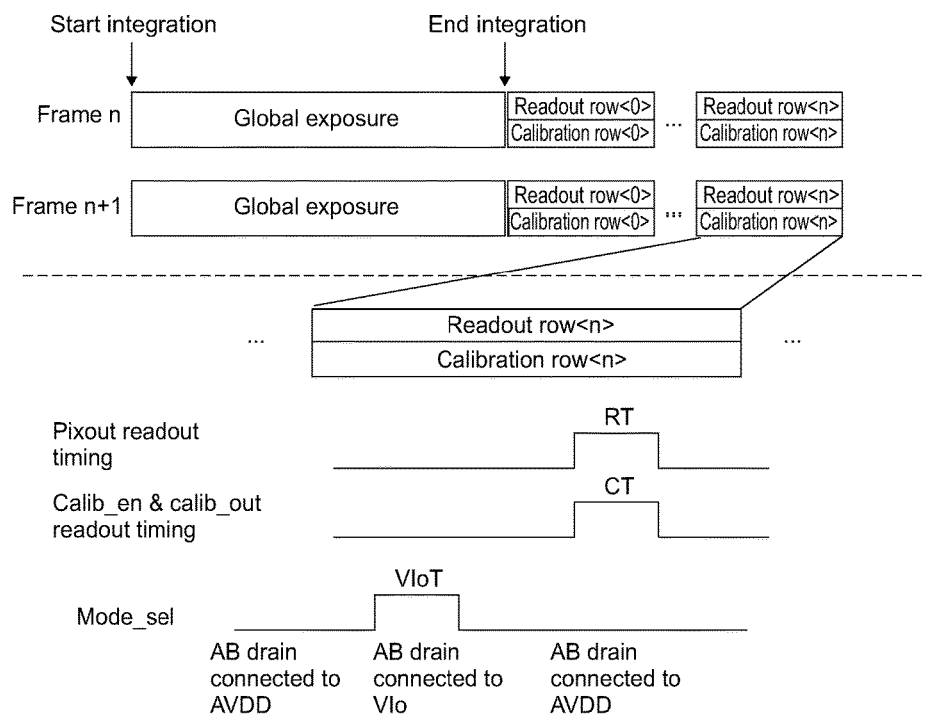
FIG. 7 is a timing diagram that illustrates a method for knee point calibration in accordance with the second embodiment of the invention.

FIG. 7 is a timing diagram that illustrates an alternative invented method for knee point calibration. Illustrated are image sensor control circuitry and readout circuitry functioning in sequences defined according to a function logic circuit, for example like function logic 106 as illustrated in FIG. 1, in defined sequences to collect and readout in a global shutter mode an image signal over two frames n and n+1. The sequence for frame n begins with a global exposure step in which all rows of an image array are exposed to incident light forming an image. FIG. 4A illustrates the movements of signals AB' and RST' during this step.

Following the global exposure step is a readout step for the zeroth row which is carried out in parallel with a calibration step for the zeroth row. The readout and calibration steps repeat for each row until the last row, row n, and then repeat for the next frame, Frame n+1. FIG. 7 additionally illustrates more detail within the readout and calibration steps. The timing line denoted "Pixel readout timing" shows pixels of row n being readout during an interval RT within the readout step. The timing line denoted "Calib_en & Calib_out readout timing" shows pixels of row n being sampled an interval CT within the calibration step. Of particular relevance to the invention is the timing line denoted "Mode_sel" wherein anti-blooming transistor AB drain electrode is shown to be connected to supply AVDD at all times throughout the readout and calibration steps except for a time interval VolT prior to intervals RT and CT during which transistor AB drain is switched to supply Vlo.

According to the inventive idea by switching the AB transistor drain to supply Vlo a programmable amount of charge is injected into each photodiode along a row. Without the interval VloT wherein the AB drain is switched to Vlo the photodiodes along the row are rendered free of most of their charge prior to the next exposure period. By switching the AB drain to Vlo it is possible to compensate for AB transistor threshold voltage variations and also to more precisely set the knee point thereby reducing fixed pattern noise and exercising more precise control over the charging characteristics of the photodiodes under high illumination. One advantage of the second embodiment of the invention over the first embodiment is that the second may operate at a faster frame rate since the readout circuitry operates readout and calibration intervals simultaneously.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An image sensor comprising:
   a plurality of global shutter imaging pixel cells, each including an anti-blooming transistor gate adjacent on one side to a photodiode and adjacent on another side to an anti-blooming transistor drain for modifying electric charge within the photodiode and for setting the photodiode to a selected potential;
   a row decoder circuit providing readout signals to each of a plurality of rows of the imaging pixel cells during both a readout interval and a calibration interval for each row and providing to the anti-blooming transistor drain a selectable potential supply voltage, the selectable potential supply voltage being either a standard drain supply voltage or an adjustable low voltage;
   a mode select switch within the row decoder circuit being operable to apply the standard drain supply voltage to the drain of the anti-blooming transistor or to apply the adjustable low voltage to the anti-blooming transistor drain; and
   a programmable function logic circuit operable to engage the mode select switch to change the potential applied to the drain of the anti-blooming transistor from the standard supply voltage to the adjustable low voltage during an interval following the readout interval and before the calibration interval of each row.

2. The image sensor of claim 1, wherein the global shutter imaging pixel cells each comprise:
   a transfer transistor connected to the photodiode on one side and to an input of a first source follower amplifier transistor on another side;
   a first switch transistor connecting an output of the first source follower amplifier transistor to a global shutter signal storage capacitor and a second switch transistor connecting the global shutter signal storage capacitor to a global shutter reset capacitor;
   a second source follower transistor wherein an input of a second source follower transistor is connected to the second switch transistor and the global shutter reset capacitor and the output of the second source follower transistor is coupled though a row select transistor to a pixel output column line.

3. A pixel cell of the imaging sensor of claim 1, wherein a programmable function logic circuit state is determined by a status of a selectable state register setting within the image sensor.

4. A pixel cell of the imaging sensor of claim 1, wherein the standard drain supply voltage is a highest level compatible with a semiconductor technology by which an image sensor is fabricated and the adjustable low voltage ranges from zero to 0.5 volts.

5. A method for reducing image sensor fixed pattern noise by calibrating a knee point of a two segment piecewise linear response curve representing a pixel image signal output versus increasing incident image light, the method comprising the steps of:

providing a plurality of global shutter imaging pixel cells, each including an anti-blooming transistor gate adjacent on one side to a photodiode and adjacent on another side to an anti-blooming transistor drain for modifying electric charge within the photodiode and for setting the photodiode to a selected potential;

providing a row decoder circuit providing readout signals to each of a plurality of rows of the imaging pixel cells during both a readout interval and a calibration interval for each row and providing to the anti-blooming transistor drain a selectable potential supply voltage, the selectable potential supply voltage being either a standard drain supply voltage or an adjustable low voltage;

providing a mode select switch within the row decoder circuit being operable to apply the standard drain supply voltage to the drain of the anti-blooming transistor or to apply the adjustable low voltage to the anti-blooming transistor drain; and operating a programmable function logic circuit to engage the mode select switch to change the potential applied to the drain of the anti-blooming transistor from the standard supply voltage to the adjustable low voltage during an interval following the readout interval and before the calibration interval of each row.

6. The method of claim 5, wherein operating the programmable function logic comprises executing a digital algorithm designed to smooth a transition at the knee point of the two segment piecewise linear response curve representing charging of a pixel photodiode due to increasing image light.

7. An image sensor comprising:
a plurality of global shutter imaging pixel cells, each including an anti-blooming transistor gate adjacent on one side to a photodiode and adjacent on another side to an anti-blooming transistor drain for modifying electric charge within the photodiode and for setting the photodiode to a selected potential and wherein the global shutter imaging pixel cells each comprise:
a transfer transistor connected to the photodiode on one side and to an input of a first source follower amplifier transistor on another side;
a calibration transistor with a gate electrode connected to a calibration enable signal node, a source coupled to a calibration output node, and a drain connected to an output of the first source follower amplifier transistor;
a first switch transistor connecting the output of the first source follower amplifier transistor to a global shutter signal storage capacitor and a second switch transistor connecting the global shutter signal storage capacitor to a global shutter reset capacitor; and
a second source follower transistor wherein an input of the second source follower transistor is connected to the second switch transistor and the global shutter reset capacitor, and an output of the second source follower transistor is coupled though a row select transistor to a pixel output column line;

a row decoder circuit providing readout signals to each of a plurality of rows of the imaging pixel cells simultaneously during both a readout interval and a calibration interval for each row and providing to the anti-blooming transistor drain a selectable potential supply voltage, the selectable potential supply voltage being either a standard drain supply voltage or an adjustable low voltage, wherein the standard drain supply voltage is a highest level compatible with a semiconductor technology by which an image sensor is fabricated and the adjustable low voltage ranges from zero to 0.5 volts;

a mode select switch within the row decoder being operable to apply the standard drain supply voltage to the drain of the anti-blooming transistor or to apply the adjustable low voltage to the anti-blooming transistor drain; and a programmable function logic circuit operable to engage the mode select switch to change the potential applied to the drain of the anti-blooming transistor from the standard supply voltage to the adjustable low voltage during an interval preceding the readout interval and the calibration interval of each row.

8. A pixel cell of the imaging sensor of claim 7, wherein a programmable function logic circuit state is determined by a status of a selectable state register setting within the image sensor.

* * * * *